United States Patent
Kwon et al.

[11] Patent Number: 5,962,994
[45] Date of Patent: Oct. 5, 1999

[54] HORIZONTAL DEFLECTION OUTPUT CIRCUIT FOR HIGH-FREQUENCY HORIZONTAL SCANNING

[75] Inventors: Joong-Yeol Kwon; Hideki Kofune, both of Suwon, Rep. of Korea

[73] Assignee: SamSung Electronics Co., Ltd., Kyungki-do, Rep. of Korea

[21] Appl. No.: 08/970,782

[22] Filed: Nov. 14, 1997

[30] Foreign Application Priority Data

Nov. 14, 1996 [KR] Rep. of Korea ........................ 96-54129

[51] Int. Cl.$^6$ ................................ G09G 1/04; H04N 3/16
[52] U.S. Cl. ........................ 315/408; 315/370; 315/399
[58] Field of Search ........................ 315/408, 399, 315/370, 371

[56] References Cited

U.S. PATENT DOCUMENTS

| | | |
|---|---|---|
| 3,795,835 | 3/1974 | Aldrich et al. . |
| 3,931,545 | 1/1976 | Marino ........................ 315/384 |
| 3,978,372 | 8/1976 | Iwabuchi . |
| 3,980,927 | 9/1976 | Haferl . |
| 3,999,101 | 12/1976 | Fischman et al. . |
| 4,019,093 | 4/1977 | Klein . |
| 4,115,725 | 9/1978 | Hashimoto . |
| 4,206,388 | 6/1980 | Ishigaki et al. . |
| 4,238,714 | 12/1980 | Sumi . |
| 4,281,275 | 7/1981 | Chapman et al. ........................ 315/399 |
| 4,442,384 | 4/1984 | Maekawa et al. . |
| 4,472,662 | 9/1984 | Freed ........................ 315/399 |
| 4,586,004 | 4/1986 | Valdez ........................ 330/300 |
| 4,625,155 | 11/1986 | Dietz ........................ 315/408 |
| 4,707,640 | 11/1987 | Onozawa et al. . |
| 4,719,394 | 1/1988 | Watanuki . |
| 4,897,581 | 1/1990 | Oguino et al. . |
| 5,019,754 | 5/1991 | Onozawa et al. . |
| 5,068,581 | 11/1991 | Nishiura et al. . |
| 5,089,756 | 2/1992 | Hennig . |
| 5,138,240 | 8/1992 | Shimura . |
| 5,262,684 | 11/1993 | Kashiwagi ........................ 327/108 |
| 5,285,133 | 2/1994 | Ogura ........................ 315/371 |
| 5,325,025 | 6/1994 | Gawell et al. . |

*Primary Examiner*—Edward P. Westin
*Assistant Examiner*—Shane R Gardner
*Attorney, Agent, or Firm*—Robert E. Bushnell, Esq.

[57] ABSTRACT

A horizontal deflection output circuit has a resonance circuit including a horizontal deflection yoke for generating the horizontal deflection signal, a first switch element, a second switch element comprising a bipolar transistor, and a circuit for applying a reverse bias voltage to the emitter-base junction of the bipolar transistor during a retrace period to remove excess minority carriers stored in its base rapidly, thereby making high speed switching operation of the transistor possible.

29 Claims, 3 Drawing Sheets

HORIZONTAL DEFLECTION OUTPUT CIRCUIT FOR HIGH-FREQUENCY HORIZONTAL SCANNING

CLAIM OF PRIORITY

This application makes reference to, incorporates the same herein, and claims all benefits accruing under 35 U.S.C. §119 from an application for HORIZONTAL DEFLECTION OUTPUT CIRCUIT earlier filed in the Korean Industrial Property Office on Nov. 14, 1996 and there duly assigned Ser. No. 54129/1996.

BACKGROUND OF THE INVENTION

1. Technical Field

The present invention relates to a horizontal deflection circuit for use in a video display monitor or television set having a CRT (cathode ray tube), and more particularly to high-frequency horizontal deflection output circuit for obtaining high picture quality.

2. Related Art

In either a display monitor or a television set having a CRT, externally supplied video signals are amplified and supplied to electron guns within the CRT to emit electron beams. At the same time, synchronizing signals, (that is, horizontal and vertical synchronizing signals) are applied to horizontal and vertical deflection circuits, respectively. Then, the deflection circuits supply horizontal and vertical deflection signals to horizontal and vertical deflection yokes, respectively, around the neck of the CRT. Accordingly, the electron beams are deflected under the control of the deflection circuits in the horizontal and vertical directions relative to the beam emitting directions.

Generally, the horizontal deflection circuit may have a phase-locked loop (PLL), an oscillator, a horizontal drive circuit for generating a horizontal driving pulse signal, and a horizontal deflection output circuit for supplying a sawtooth wave current to the horizontal deflection yoke.

As stated in more detail below, conventional horizontal deflection output circuits employ, as one component thereof, a bipolar transistor which becomes saturated when it is operating as a closed switch; that is, an excessive amount of minority carriers is stored in the base of the bipolar transistor. As a result, the transistor cannot immediately respond to a subsequent transition in its operational state. As a result, such a conventional horizontal deflection output circuit having a bipolar transistor is not suitable for use in high-frequency horizontal scanning (above 30 KHz).

The following patents are considered to be representative of the prior art relative to the present invention, and are burdened by the disadvantage discussed above: U.S. Pat. No. 5,325,025 to Gawell et al., entitled Multiple Frequency Horizontal Scan Compensation System, U.S. Pat. No. 5,138,240 to Shimura, entitled Horizontal Deflection Driving Circuit, U.S. Pat. No. 5,089,756 to Hennig, entitled Deflection Driver In A Video Apparatus, U.S. Pat. No. 5,068,581 to Nishiura et al., entitled Horizontal Deflection Circuit For High-Frequency Scanning, U.S. Pat. No. 5,019,754 to Onozawa et al., entitled Horizontal Deflection Circuit, U.S. Pat. No. 4,897,581 to Oguino et al., entitled Horizontal Deflection Circuit, U.S. Pat. No. 4,719,394 to Watanuki, entitled Horizontal Output Circuit, U.S. Pat. No. 4,707,640 to Onozawa et al, entitled Horizontal Deflection Output Circuit, U.S. Pat. No. 4,472,662 to Freed, entitled Deflection Circuit, U.S. Pat. No. 4,442,384 to Maekawa et al., entitled Horizontal Deflection Circuit, U.S. Pat. No. 4,238,714 to Sumi, entitled Horizontal Deflection Output Circuit, U.S. Pat. No. 4,206,388 to Ishigaki et al., entitled Current Control Circuit For Horizontal Deflection Coil Of Television Receiver, U.S. Pat. No. 4,115,725 to Hashimoto, entitled Horizontal Deflection Circuit, U.S. Pat. No. 4,019,093 to Klein, entitled Horizontal Dynamic Damper Circuitry, U.S. Pat. No. 3,999,101 to Fischman et al, entitled Horizontal Deflection System, U.S. Pat. No. 3,980,927 to Haferl, entitled Deflection Circuit, U.S. Pat. No. 3,978,372 to Iwabuchi, entitled Vertical Deflection Output Circuit, U.S. Pat. No. 3,931,545 to Marino, entitled Horizontal Deflection Circuit, and U.S. Pat. No. 3,795,835 to Aldrich et al., entitled Horizontal Linearity Correction Circuit.

SUMMARY OF THE INVENTION

It is, therefore, an object of the present invention to provide a horizontal deflection output circuit for high speed operation.

It is another object of the present invention to provide a horizontal deflection output circuit having improved power loss.

In order to attain the above-described objects, according to an aspect of the present invention, there is provided a horizontal deflection output circuit for providing a horizontal deflection signal to a deflection yoke of a CRT having first switching means responsive to the horizontal deflection driving signal, second switching means connected between the horizontal deflection yoke and the first switching means and controlled as to its switching operation by the first switching means, resonant means for forming a resonance circuit with the deflection yoke to oscillate the horizontal deflection signal flowing through the deflection yoke, and damping means for preventing oscillation of the horizontal deflection signal by the resonance circuit when the polarity of a voltage induced on the deflection yoke changes.

Preferably, the first switching means comprises a metal oxide semiconductor field effect transistor (MOSFET), and the second switching means comprises a power source. A bipolar transistor having an emitter connected to the first switching means, a base connected through a first resistor to the power source, and a collector connected to the resonance circuit are also provided.

Furthermore, the horizontal deflection output circuit, according to the present invention, includes means for applying a reverse bias voltage to an emitter-base junction of the bipolar transistor during a retrace period.

Still further, the horizontal deflection output circuit, according to the present invention, includes clipping means for limiting a base voltage of the bipolar transistor to a terminal voltage of the power source.

According to another aspect of the present invention, there is provided a horizontal deflection output circuit for providing a horizontal deflection signal to a CRT in response to a horizontal deflection driving signal, including first switching means responsive to the horizontal deflection driving signal, second switching means having a bipolar transistor and controlled as to its switching operation by the first switching means, means for removing excessive minority carriers stored in the base of the bipolar transistor during a retrace period, and a resonance circuit for generating the horizontal deflection signal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
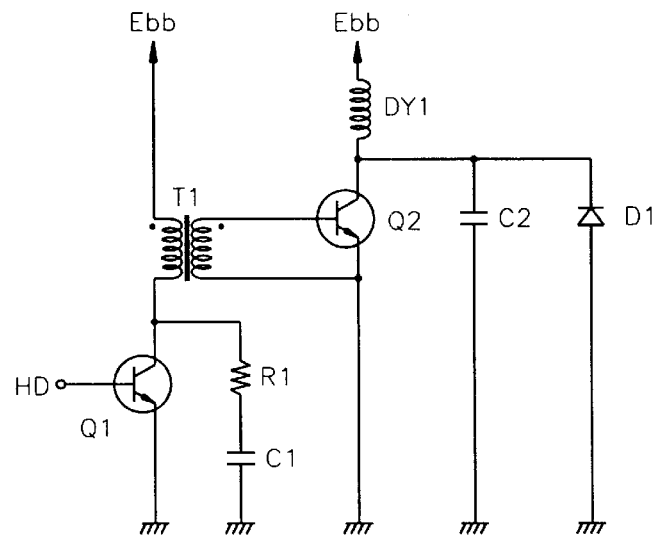
FIG. 1 is a circuit diagram showing a conventional horizontal deflection output circuit.

FIG. 1 shows a conventional horizontal deflection output circuit in which a horizontal deflection yoke DY1, a resonant capacitor C2, a damper diode D1, a driving transformer T1, bipolar transistors Q1 and Q2, a damper resistor R1, and a damper capacitor C1 are provided. The bipolar transistor Q1 is operated as a switch responsive to a horizontal driving signal HD in the pulse wave applied to its base. The bipolar transistor Q2 also functions as a switch responsive to the voltage induced on the secondary windings (secondary voltage) of the driving transformer T1, which voltage is applied to its emitter-base junction.

In this conventional circuit, the transistor Q2 is saturated while it behaves as a closed switch. In such a saturation mode, an excessive amount of minority carriers is stored in the base of the transistor Q2. The excess charge due to the minority carriers is proportional to the amount of the base current.

The transistor Q2 cannot immediately respond to the subsequent transition of the transformer secondary voltage level to make it an open switch until the excess charge has been removed. The interval which elapses between the transition of the input signal and the time when the collector current has dropped to about 90 percent of the collector saturation current is generally called the storage time. The storage time of the transistor Q2 is approximately 2–3 μs. Consequently, the conventional deflection output circuit is unsuitable for high-frequency horizontal scanning (above 30 KHz). Also, the use of the transformer results in high cost and high power loss.

The following detailed description describes the best modes presently contemplated by the inventors for practicing the invention. It should be understood that the description of this preferred embodiment is merely illustrative and that it should not be taken in a limiting sense.

Figure 2:
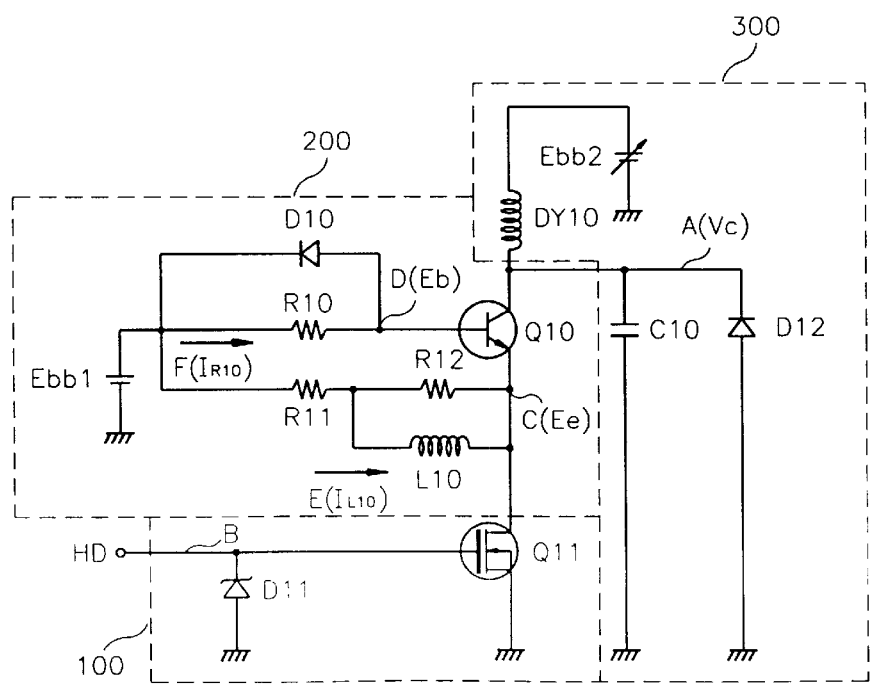
FIG. 2 is a circuit diagram showing an embodiment of a horizontal deflection output circuit in accordance with the present invention.

Referring to FIG. 2, there is illustrated an embodiment of a horizontal deflection output circuit for high-frequency operation in accordance with the present invention. As shown, the deflection output circuit comprises a first switching circuit 100 operated as a switch in response to a horizontal deflection driving signal HD, a second switching circuit 200 whose operation is controlled by the first switching circuit 100, and a resonance circuit 300 for generating a horizontal deflection signal.

The first switching circuit 100 includes an N-MOSFET Q11 having a gate supplied with the horizontal deflection driving signal HD from a horizontal driving circuit (not shown) and a grounded source, and a Zener diode D11 having an anode and a cathode connected to ground and the gate of the transistor Q11, respectively.

The second switching circuit 200 has a DC power source Ebb1, an NPN bipolar transistor Q10, resistors R10 to R12, a diode D10, and an inductor L10. The emitter of transistor Q10 is connected to the drain of the transfer Q11, and its base is connected through the resistor R10 to the power source Ebb1. The diode D10 is connected in parallel with the resistor R10, of which the anode and cathode are connected to the base of the transistor Q10 and the power source Ebb1, respectively. The resistors R11 and R12 are connected in series with each other between the power source Ebb1 and the emitter of the transistor Q10. The inductor L10 is connected in parallel with the resistor R12.

The resonance circuit 300 has a horizontal deflection yoke DY10, a variable power source Ebb2, a resonant capacitor C10, and a damper diode D12. The horizontal deflection yoke DY10 and the resonant capacitor C10 are connected in series with each other between the power source Ebb2 and ground. The damper diode D12 is connected in parallel with the capacitor C10, and its anode and cathode are connected to ground and to the junction of the yoke DY10 and the capacitor C10, respectively.

Figure 3:
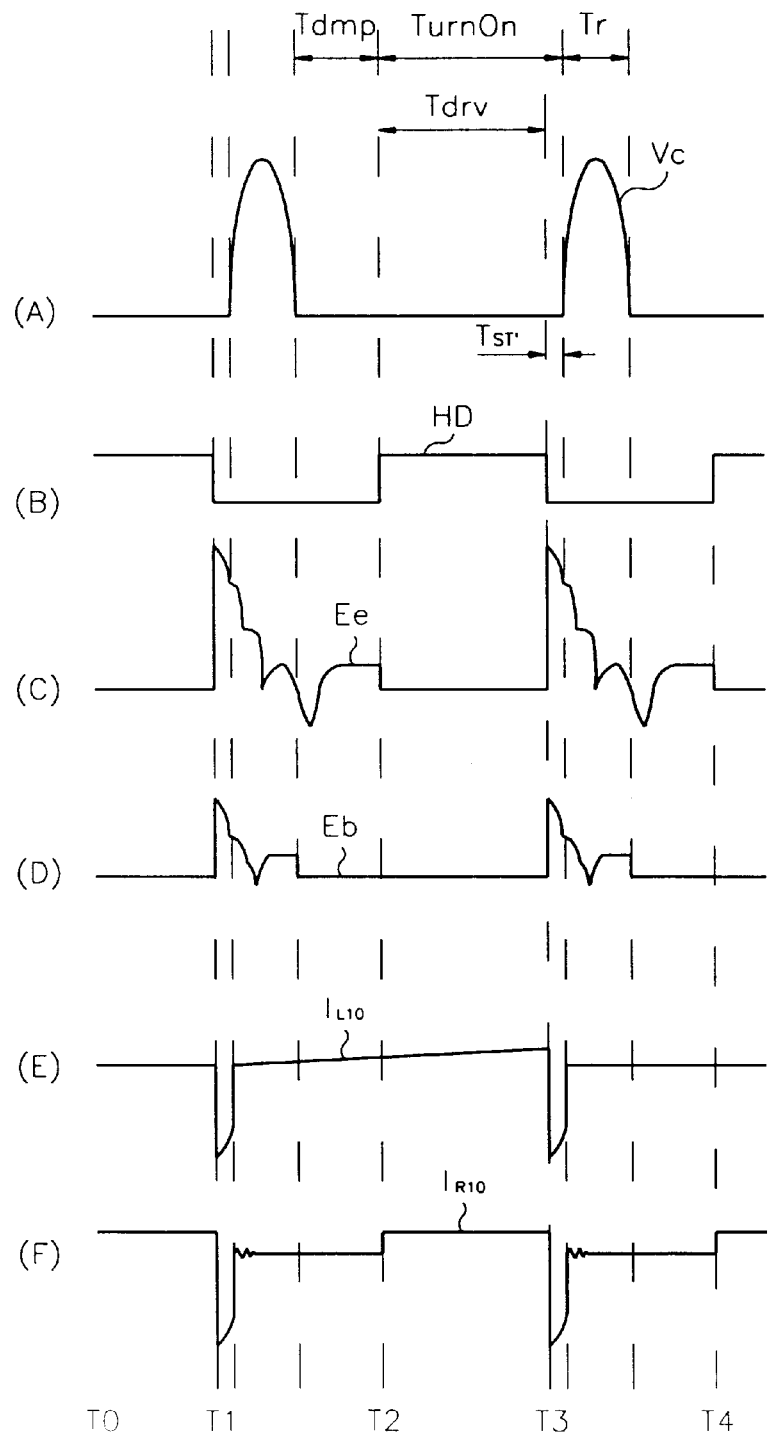
FIG. 3 is a waveform chart showing signal waveforms of the individual portions of the horizontal deflection output circuit of FIG. 2.

Operation will now be described with reference to FIG. 3 which shows signal waveforms of the individual points A to F, respectively, of the horizontal deflection output circuit of FIG. 2. FIG. 3(A) shows the waveform of the voltage Vc at the node A between the deflection yoke DY10 and the capacitor C10. FIG. 3(B) shows the voltage waveform of the horizontal driving signal HD applied to the gate of FET Q11. FIGS. 3(C) and 3(D) show the waveforms of the emitter voltage Ee and base voltage Eb, respectively, of the transistor Q10. FIG. 3(E) shows the waveform of the current $I_{L10}$ flowing through the inductor L10. FIG. 3(F) shows the waveform of the current $I_{R10}$ flowing through the resistor R10. In FIG. 3, the term "Tdmp" is the damp time of damping resistor R12; "Turn On" is the turn-on time of bipolar transistor Q10; "Tdry" is the turn-one time of FET Q11 or horizontal deflection driving time; and "$T_{ST}$" is the storage time of transistor Q10.

Transistor Q11 is switched on or off by the horizontal deflection driving signal HD, the voltage level of which is limited by the Zener diode D11. The duty cycle of the horizontal deflection driving signal HD is substantially equal to 50%. Transistor Q11 is turned on when its gate is supplied with the signal HD of a high level (e.g., for period T0 to T1). The emitter voltage Ee of the bipolar transistor Q10 is then equal to ground level (i.e., 0 volts). The emitter-base junction of the transistor Q10 is thus forward-biased, so that the transistor Q10 becomes conductive. Assuming that the base current of the transistor Q10 is large enough, the transistor Q10 is saturated, and this results in it functioning as a closed switch. The collector voltage of the transistor Q10 is also on the order of the base voltage Eb, and the current $I_{L10}$ flowing through the inductor L10 is approximately given by the following equation (1):

$$I_{L10} \approx \frac{E_{bb1}}{L_{10}}t \qquad (1)$$

where $L_{10}$ is inductance of the inductor L10 and t is time interval during which the current flows through the inductor L10.

Figure 4:
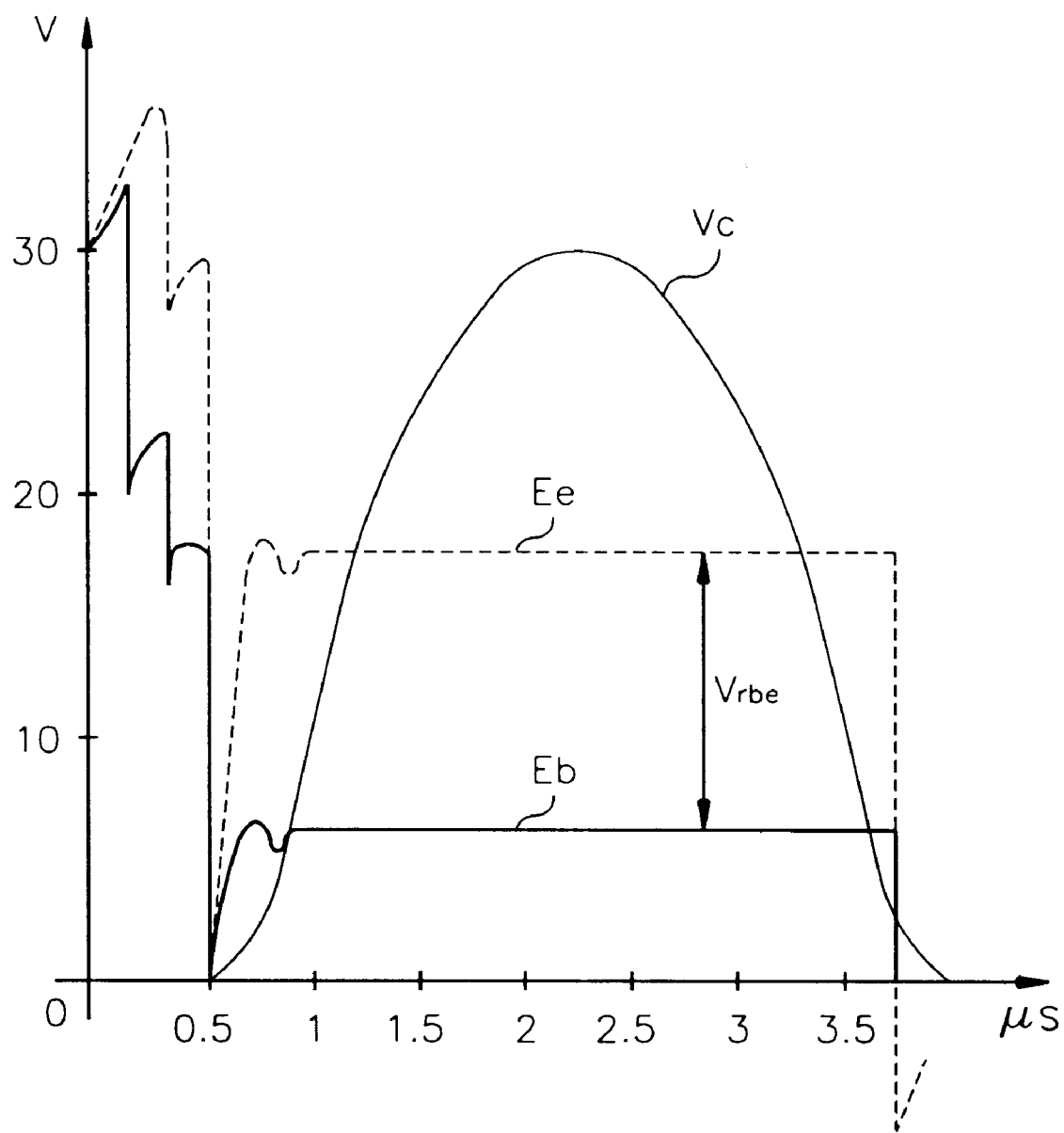
FIG. 4 is a detailed waveform chart showing waveforms of emitter and base voltages of the bipolar transistor and terminal voltage of the resonant capacitor, as seen in FIG. 2, during a retrace period.

On the other hand, FET Q11 is turned off when its gate is supplied with a signal HD of a low level (e.g., for period T1 to T2). During a retrace period, a voltage (often referred to as a counter-electromotive force) which has the same polarity as that of the power source Ebb1 is induced on the inductor L10, and thereby the emitter voltage Ee increases to an amount greater than the base voltage Eb. In FIG. 4, the waveforms of emitter and base voltages Eb and Ee, and the terminal voltage Vc of the resonant capacitor C10 during the retrace period, are plotted in more detail. As shown in the figure, the emitter-base junction of the transistor Q10 is supplied with a reverse-bias voltage Vrbe during the retrace period. As a result, the minority carriers stored in the base during the saturation mode of the transistor Q10 are removed at quite a rapid rate compared to the conventional circuit, causing the storage time (about 1 $\mu$s) of the transistor Q10 to be reduced (about 2–3 $\mu$s) relative to the conventional circuit of FIG. 1. The reverse bias voltage Vrbe during the switching transition for retrace makes high speed switching operation of the transistor Q10 possible.

The inductor L10 must have enough inductance to store an energy Pstr needed to remove all minority carriers in the base. The inductance $L_{10}$ of the inductor L10 is approximated by the following equation (2):

$$L_{10} = \frac{1}{2} \frac{(E_{bb} - 0.5)^2}{P_{str}} T_{ON} \qquad (2)$$

where $T_{ON}$ is turn-on time of the MOSFET Q11.

In the circuit 200, oscillation of the induced voltage or current on the inductor L10 is prevented by resistor R12. The diode D10 is also provided to limit the base voltage of the transistor Q10 to a terminal voltage of the power source Ebb1. This permits use of a bipolar transistor of low rating as the transistor Q10.

As described above, the switching operation of the bipolar transistor Q10 is controlled by that of the FET Q11. In response to the ON and OFF operations of the transistor Q10, the voltage Vc is generated (as shown in FIG. 3(A)) at node A between the horizontal deflection yoke DY10 and the resonant capacitor C2. When the bipolar transistor Q10 is conducting, a current begins to flow out of the power source Ebb2 through the horizontal deflection yoke DY10 and the collector of the transistor Q10, and the current then increases linearly. This change in the circuit current causes a magnetic field. As a result, the deflection yoke DY10 receives electrical energy and stores it in the form of a magnetic field.

If the transistor Q10 is turned off, the magnetic field will collapse as it no longer has current to support it. As the magnetic lines of force collapse, they cut the deflection yoke DY10, causing relative motion between the deflection yoke DY10 and the magnetic field. A voltage is induced in the deflection yoke DY10, which causes an induced current to flow in the same direction as the circuit current flowing before the transistor Q10 is turned off. The deflection yoke now converts the magnetic field energy into electrical energy and returns the energy that it originally stored. Owing to the induced voltage or current, the resonant capacitor C2 is charged up to the maximum level of the voltage Vc, as shown in FIGS. 3(A) and 4.

After a short period of time, the magnetic field has totally collapsed, the induced voltage is zero, and the induced current within the circuit 300 is, therefore, no longer present. Subsequently, the resonant capacitor C10 is discharged so that a discharge current flows through the deflection yoke DY10 in the reverse direction. The time interval for the charging and discharging of the capacitor C10 corresponds to the retrace period.

Next, if the discharging of the capacitor C10 is completed, (that is, if the current flowing from the capacitor C10 to the deflection yoke DY10 is zero), the polarity of the voltage induced on the deflection yoke DY10 is converted. As a result, the damper diode D12 is rendered conductive, thereby preventing oscillation of the induced voltage or current on the deflection yoke DY10 due to the resonance circuit formed by the deflection yoke DY10 and the resonant capacitor C10. When the damper diode D12 is conductive, the current flowing through the deflection yoke DY10 is gradually decreased while the left half of a line scanning is performed.

As described above, according to the present invention, because the minority carriers stored in base are removed rapidly during the level transition of the horizontal driving signal, high-frequency horizontal scanning of 60–100 KHz is possible. Also, a horizontal deflection output circuit of low cost, low power-consumption and high reliability can be obtained since no transformer is used.

What is claimed is:

1. A horizontal deflection output circuit for providing a horizontal deflection signal to a deflection yoke of a cathode ray tube in response to a horizontal deflection driving signal, comprising:

first switching means responsive to the horizontal deflection driving signal for providing a control signal;

second switching means connected between said first switching means and the horizontal deflection yoke, and responsive to said control signal for carrying out a switching operation, wherein said second switching means includes a power source and a bipolar transistor, said bipolar transistor having an emitter connected to said first switching means, a base connected directly through a first resistor to said power source, and a collector, said emitter and said base forming an emitter-base junction;

bias means for applying a reverse bias voltage to said emitter-base junction of said bipolar transistor during a retrace period;

resonant means for forming, with the deflection yoke, a resonance circuit connected to said collector so as to oscillate the horizontal deflection signal flowing through the deflection yoke; and damping means for preventing oscillation of the horizontal deflection signal by the resonance circuit when a polarity of a voltage induced on the deflection yoke changes.

2. A horizontal deflection output circuit according to claim 1, wherein the bias means comprises an inductor having one end connected to the emitter of the bipolar transistor, and another end connected through a second resistor to the power source.

3. A horizontal deflection output circuit according to claim 1, further comprising clipping means for limiting a base voltage of the bipolar transistor to a terminal voltage of the power source.

4. A horizontal deflection output circuit according to claim 3, wherein said clipping means comprises a diode connected in parallel with said first resistor.

5. A horizontal deflection output circuit according to claim 1, wherein said bias means comprises an inductor and a damping element for preventing oscillation of an induced signal on the inductor.

6. A horizontal deflection output circuit according to claim 5, wherein said damping element comprises a second resistor connected in parallel with the inductor.

7. A horizontal deflection output circuit according to claim 1, wherein said first switching means comprises a metal oxide semiconductor field effect transistor.

8. A horizontal deflection output circuit for providing a horizontal deflection output signal to a cathode ray tube in response to a horizontal deflection driving signal, comprising:

first switching means responsive to the horizontal deflection driving signal for providing a control signal;

second switching means including a bipolar transistor, and responsive to said control signal for carrying out a switching operation, said bipolar transistor having a base which tends to store minority carriers;

means for removing excess minority carriers stored in said base of said bipolar transistor during a retrace period; and resonance circuit means connected to said second switching means for generating the horizontal deflection output signal;

wherein said second switching means further comprises a power source connected to said base of said bipolar transistor, said bipolar transistor having an emitter; and wherein said means for removing the excess minority carriers comprises an inductor having one end connected directly to said emitter and another end connected directly through a resistor to said power source.

9. A horizontal deflection output circuit according to claim 8, said emitter being connected to said first switching means, said bipolar transistor having a collector connected to said resonance circuit means.

10. A horizontal deflection output circuit according to claim 9, further comprising clipping means for limiting a base voltage of said bipolar transistor to a terminal voltage of said power source.

11. A horizontal deflection output circuit according to claim 10, wherein said clipping means comprises a diode connected in parallel with said resistor.

12. A horizontal deflection output circuit for providing a horizontal deflection output signal to a cathode ray tube in response to a horizontal deflection driving signal, comprising:

resonance circuit means including a horizontal deflection yoke for generating the horizontal deflection output signal;

a first switching element responsive to the horizontal deflection driving signal;

a second switching element connected to said first switching element and including a power source, a first resistor connected directly to said power source, and a bipolar transistor, said bipolar transistor having a collector connected to said resonance circuit means, a base connected to said first resistor, and an emitter connected to said first switching element, said second switching element further comprising a second resistor connected to said power source and said emitter, said emitter and said base forming an emitter-base junction; and bias means for applying a reverse bias voltage to said emitter-base junction of said bipolar transistor during a retrace period.

13. A horizontal deflection output circuit according to claim 12, wherein said bias means comprises an inductor connected between said second resistor and said emitter of said bipolar transistor.

14. A horizontal deflection output circuit according to claim 12, wherein said bias means comprises an inductor connected between said second resistor and said emitter of said bipolar transistor, and a third resistor connected in parallel with said inductor.

15. A horizontal deflection output circuit according to claim 12, further comprising means for limiting a base voltage of said bipolar transistor to a terminal voltage of said power source.

16. A horizontal deflection output circuit for providing a horizontal deflection signal to a deflection yoke of a cathode ray tube in response to a horizontal deflection driving signal, comprising:

a first switch responsive to the horizontal deflection driving signal for providing a control signal;

a second switch connected between said first switch and the horizontal deflection yoke, and responsive to said control signal for carrying out a switching operation, wherein said second switch includes a power source and a switching element, said switching element having a first electrode connected to said first switch, a second electrode connected directly through a first resistor to said power source, and a third electrode, said first and second electrodes forming a junction;

a bias circuit for applying a reverse bias voltage to said junction during a retrace period;

a resonant circuit connected to said third electrode so as to oscillate the horizontal deflection signal flowing through the deflection yoke; and a damping circuit for preventing oscillation of the horizontal deflection signal by the resonance circuit when a polarity of a voltage induced on the deflection yoke changes.

17. The circuit of claim 16, wherein the bias circuit comprises an inductor having one end connected to the first electrode and another end connected through a second resistor to the power source.

18. The circuit of claim 16, further comprising a clipping circuit for limiting an input voltage of the switching element to a terminal voltage of the power source.

19. The circuit of claim 18, wherein said clipping circuit comprises a diode connected in parallel with the first resistor.

20. The circuit of claim 16, wherein said bias circuit comprises an inductor and a damping element for preventing oscillation of an induced signal on the inductor.

21. The circuit of claim 20 wherein said damping element comprises a second resistor connected in parallel with the inductor.

22. A horizontal deflection output circuit for providing a horizontal deflection output signal to a cathode ray tube in response to a horizontal deflection driving signal, comprising:

a first switch responsive to the horizontal deflection driving signal for providing a control signal;

a second switch including a switching element responsive to said control signal for carrying out a switching operation, said switching element having a first electrode which tends to store minority carriers;

means for removing excess minority carriers stored in said first electrode during a retrace period; and a resonance circuit connected to said second switch for generating the horizontal deflection output signal;

wherein said second switch further comprises a power source connected to said first electrode, said switching element having a second electrode; and wherein said means for removing the excess minority carriers comprises an inductor having one end connected directly to said second electrode and another end connected directly through a resistor to said power source.

23. The circuit of claim 22, said second electrode being connected to said first switch and said switching element having a third electrode connected to said resonance circuit means.

24. The circuit of claim 22, further comprising a clipping circuit for limiting an input voltage of the switching element to a terminal voltage of the power source.

25. The circuit of claim 24, wherein said clipping circuit comprises a diode.

26. A horizontal deflection output circuit for providing a horizontal deflection output signal to a cathode ray tube in response to a horizontal deflection driving signal, comprising:

a resonance circuit including a horizontal deflection yoke for generating the horizontal deflection output signal;

a first switching element responsive to the horizontal deflection driving signal;

a second switching element connected to said first switching element and including a power source, a first resistor connected directly to said power source, and a switch having a first electrode connected to said resonance circuit, a second electrode serving as a central electrode connected to said first resistor, and a third electrode connected to said first switching element, said second switching element further comprising a second resistor connected to said power source and said third electrode, said second and third electrodes forming a junction; and a bias circuit for applying a reverse bias voltage to said junction during a retrace period.

27. The circuit of claim 26, further comprising a circuit for limiting an input voltage of said switch to a terminal voltage of said power source.

28. The circuit of claim 26, wherein said bias circuit comprises an inductor connected between said second resistor and said third electrode.

29. The circuit of claim 28, wherein said bias circuit further comprises a third resistor connected in parallel with said inductor.

* * * * *